(12) United States Patent
Miyajima et al.

(10) Patent No.: US 9,952,504 B2
(45) Date of Patent: Apr. 24, 2018

(54) IMPRINT METHOD, IMPRINT APPARATUS, AND METHOD FOR MANUFACTURING DEVICE

(71) Applicant: CANON KABUSHIKI KAISHA, Tokyo (JP)

(72) Inventors: Yoshikazu Miyajima, Utsunomiya (JP); Yukio Takabayashi, Saitama (JP); Shinichi Shudo, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 582 days.

(21) Appl. No.: 14/313,864

(22) Filed: Jun. 24, 2014

(65) Prior Publication Data

US 2015/0001746 A1 Jan. 1, 2015

(30) Foreign Application Priority Data

Jun. 28, 2013 (JP) ................. 2013-136919

(51) Int. Cl.
| | |
|---|---|
| B29C 59/00 | (2006.01) |
| B29C 59/02 | (2006.01) |
| G03F 7/00 | (2006.01) |
| B29C 43/58 | (2006.01) |

(52) U.S. Cl.
CPC ............ *G03F 7/0002* (2013.01); *B29C 43/58* (2013.01); *B29C 59/002* (2013.01); *B29C 59/02* (2013.01)

(58) Field of Classification Search
CPC ... G03F 7/0002; B29C 59/002; B29C 59/022; B29C 43/58; B29C 43/585; B29C 2043/585

USPC ......................................................... 264/219
See application file for complete search history.

(56) References Cited

U.S. PATENT DOCUMENTS

| | | | |
|---|---|---|---|
| 6,921,615 B2 | 7/2005 | Sreenivasan | |
| 7,815,425 B2 * | 10/2010 | Tokita | B29C 43/003 264/1.36 |
| 7,846,266 B1 | 12/2010 | Dibiase | |
| 9,128,371 B2 * | 9/2015 | Kurosawa | G03F 7/0002 |
| 9,442,370 B2 | 9/2016 | Sato | |
| 2007/0085987 A1 * | 4/2007 | Ottens | G03F 7/7065 355/53 |

(Continued)

FOREIGN PATENT DOCUMENTS

| | | |
|---|---|---|
| CN | 1952777 A | 4/2007 |
| CN | 102004393 A | 4/2011 |

(Continued)

*Primary Examiner* — Alison L Hindenlang
*Assistant Examiner* — Emmanuel S Luk
(74) *Attorney, Agent, or Firm* — Canon U.S.A., Inc. IP Division

(57) ABSTRACT

An imprint method for transferring a pattern to an imprint material supplied to a plurality of shot areas on a substrate using a mold includes removing a foreign matter attached to a pattern of the mold in such a manner that the plurality of shot areas includes a part shot-area where a part of pattern of the mold can be formed and the mold is brought into contact with an imprint material supplied to the part shot-area to transfer the pattern of the mold to the substrate and transferring a pattern to the shot area excluding the part shot-area, among the plurality of shot areas, using the mold used in the removing the foreign matter.

3 Claims, 8 Drawing Sheets

(56) References Cited

U.S. PATENT DOCUMENTS

| | | | |
|---|---|---|---|
| 2007/0138414 A1* | 6/2007 | Stevens | G01N 21/94 250/504 R |
| 2007/0140910 A1* | 6/2007 | Banine | G01N 25/142 422/83 |
| 2007/0176320 A1 | 8/2007 | Nakamura | |
| 2007/0263200 A1* | 11/2007 | Petrus Compen | G03F 7/70783 355/72 |
| 2008/0191372 A1 | 8/2008 | Takaoka | |
| 2009/0267267 A1 | 10/2009 | Yoneda | |
| 2010/0072647 A1 | 3/2010 | Tokue | |
| 2010/0072664 A1 | 3/2010 | Kawakami | |
| 2010/0097587 A1* | 4/2010 | Petrus De Jong | G03F 7/70341 355/30 |
| 2011/0198769 A1* | 8/2011 | Maeda | B82Y 10/00 264/40.5 |
| 2011/0273687 A1* | 11/2011 | Leenders | G03B 27/42 355/53 |
| 2012/0196389 A1* | 8/2012 | Matsuoka | H01L 22/12 438/17 |
| 2012/0217675 A1 | 8/2012 | Usui | |
| 2012/0313293 A1 | 12/2012 | Wakabayashi | |
| 2013/0015597 A1 | 1/2013 | Hattori | |
| 2013/0224322 A1* | 8/2013 | Shizawa | B29C 33/72 425/155 |
| 2014/0070437 A1* | 3/2014 | Ota | B29C 33/72 264/39 |
| 2014/0339721 A1 | 11/2014 | Toshima | |
| 2014/0346700 A1 | 11/2014 | Sato | |
| 2014/0367874 A1* | 12/2014 | Yamamoto | G03F 7/0002 264/40.1 |
| 2015/0049317 A1* | 2/2015 | Mishima | G03F 7/0002 355/67 |
| 2015/0174816 A1* | 6/2015 | Mizuno | B29C 59/026 264/101 |
| 2015/0192529 A1* | 7/2015 | Sato | G01N 21/88 438/16 |
| 2015/0338751 A1* | 11/2015 | Ogura | G03F 7/70725 355/72 |
| 2016/0016353 A1* | 1/2016 | Yamamoto | G03F 7/0002 264/40.1 |
| 2016/0136872 A1* | 5/2016 | Yanagisawa | G03F 7/0002 264/40.1 |
| 2016/0236381 A1* | 8/2016 | Takemura | B29C 43/58 |
| 2017/0016112 A1* | 1/2017 | Tanaka | C23C 16/44 |

FOREIGN PATENT DOCUMENTS

| | | |
|---|---|---|
| JP | 2005-116978 A | 4/2005 |
| JP | 2006-165371 A | 6/2006 |
| JP | 2007-103924 A | 4/2007 |
| JP | 2007-230229 A | 9/2007 |
| JP | 2007-281072 A | 10/2007 |
| JP | 2009016000 A | 1/2009 |
| JP | 2009-088264 A | 4/2009 |
| JP | 2009-266841 A | 11/2009 |
| JP | 2010-093187 A | 4/2010 |
| JP | 2010-225693 A | 10/2010 |
| JP | 2011009250 A | 1/2011 |
| JP | 2011097025 A | 5/2011 |
| JP | 2012-054322 A | 3/2012 |
| JP | 2012084732 A | 4/2012 |
| JP | 2012134558 A | 7/2012 |
| JP | 2012-186390 A | 9/2012 |
| JP | 2012-238674 A | 12/2012 |
| JP | 2013-008911 A | 1/2013 |
| JP | 2013-026436 A | 2/2013 |
| JP | 2013026288 A | 2/2013 |
| KR | 10-2003-0079909 A | 10/2003 |
| KR | 10-2008-0103834 A | 11/2008 |
| KR | 10-0916177 B1 | 9/2009 |
| KR | 10-2012-0098427 A | 9/2012 |
| KR | 20120102014 A | 9/2012 |
| KR | 10-2013-0009630 A | 1/2013 |
| TW | 201302419 A1 | 1/2013 |

\* cited by examiner

FIG. 2
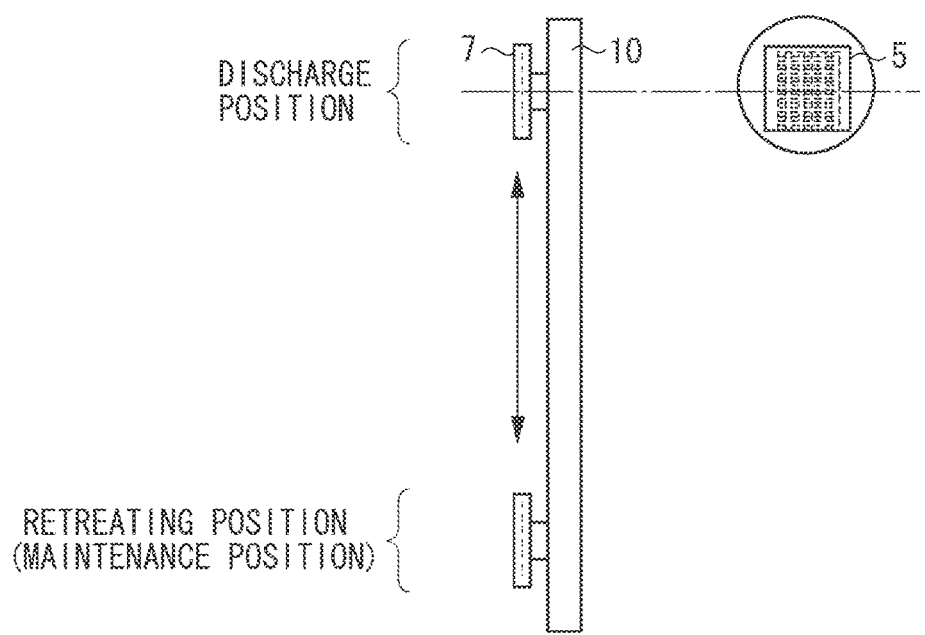
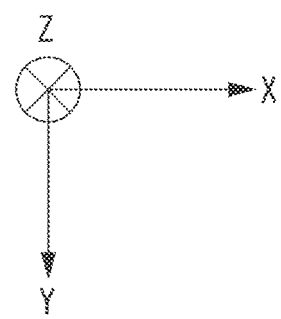

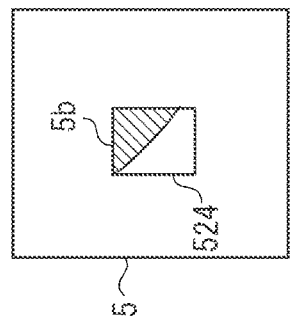
FIG. 6A
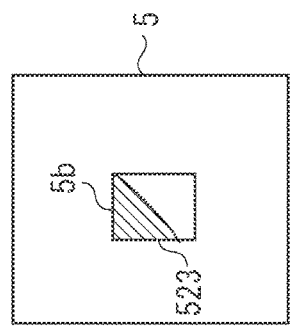
FIG. 6B
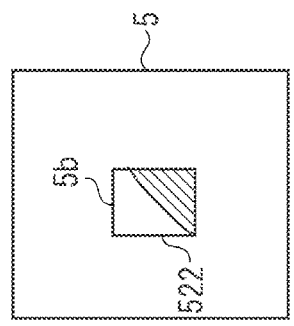
FIG. 6C
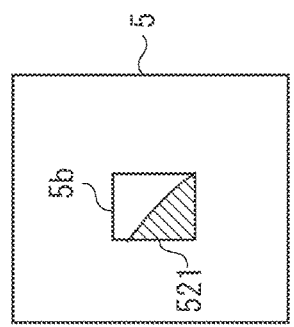
FIG. 6D
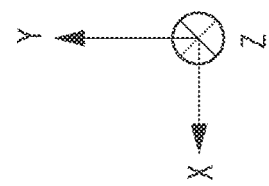

IMPRINT METHOD, IMPRINT APPARATUS, AND METHOD FOR MANUFACTURING DEVICE

BACKGROUND OF THE INVENTION

Field of the Invention

The present invention relates to an imprint method in which an imprint material on a substrate is brought into contact with a mold and is cured in the contact state to form a pattern in the imprint material.

Description of the Related Art

An imprint technique has been known as a technique for manufacturing a semiconductor device. The imprint technique is a technique for forming a pattern in an imprint material provided on a substrate using a mold on which a pattern is formed.

In the imprint technique, if the imprint material is brought into contact with the mold with a foreign matter attached to the pattern formed in the mold, the pattern cannot be accurately formed on the substrate.

In the imprint technique, therefore, the foreign matter attached to the mold is removed and then the pattern needs to be formed on the substrate. Japanese Patent Application Laid-Open No. 2009-266841 discusses an imprint apparatus in which imprint is performed on a dummy wafer to remove a foreign matter attached to a mold.

In a case where a pattern is formed in a plurality of shot areas on a substrate using the imprint technique, the pattern is repetitively formed for each shot area to form the pattern in the plurality of shot areas. It was found that the pattern could not be often accurately formed due to the foreign matter attached to the mold in the shot area where the pattern is first formed after the substrate with a plurality of shot areas is carried into the imprint apparatus. This proves that the foreign matter often attaches to the mold while the substrate is carried out of the imprint apparatus and a new substrate is carried into the imprint apparatus.

Even if the foreign matter attached to the mold is removed using the dummy wafer as discussed in Japanese Patent Application Laid-Open No. 2009-266841, a foreign matter may be attached to the mold while the dummy wafer is carried out of the imprint apparatus and a new substrate is carried into the imprint apparatus. For this reason, a pattern may not be accurately formed in the shot area where a pattern is first formed.

SUMMARY OF THE INVENTION

The present disclosure is directed to an imprint method capable of forming a pattern of a mold in a shot area of a substrate with the influence of a foreign matter attached to a mold suppressed.

According to an aspect disclosed herein, an imprint method for transferring a pattern to a plurality of shot areas on a substrate using a mold includes a step of removing a foreign matter attached to a pattern of the mold such that the plurality of shot areas includes a part shot-area where a part of pattern of the mold can be formed and the mold is brought into contact with an imprint material supplied to the part shot-area to transfer the pattern of the mold to the substrate and a step of transferring a pattern to the shot area excluding the part shot-area, among the plurality of shot areas, using the mold used in the removing the foreign matter.

Further features of the present invention will become apparent from the following description of exemplary embodiments with reference to the attached drawings.

BRIEF DESCRIPTION OF THE DRAWINGS

FIG. 2 illustrates a layout of a supply unit.

FIGS. 6A, 6B, 6C, and 6D illustrate areas where a pattern area of a mold is brought into contact with a resin.

DESCRIPTION OF THE EMBODIMENTS

Figure 1:
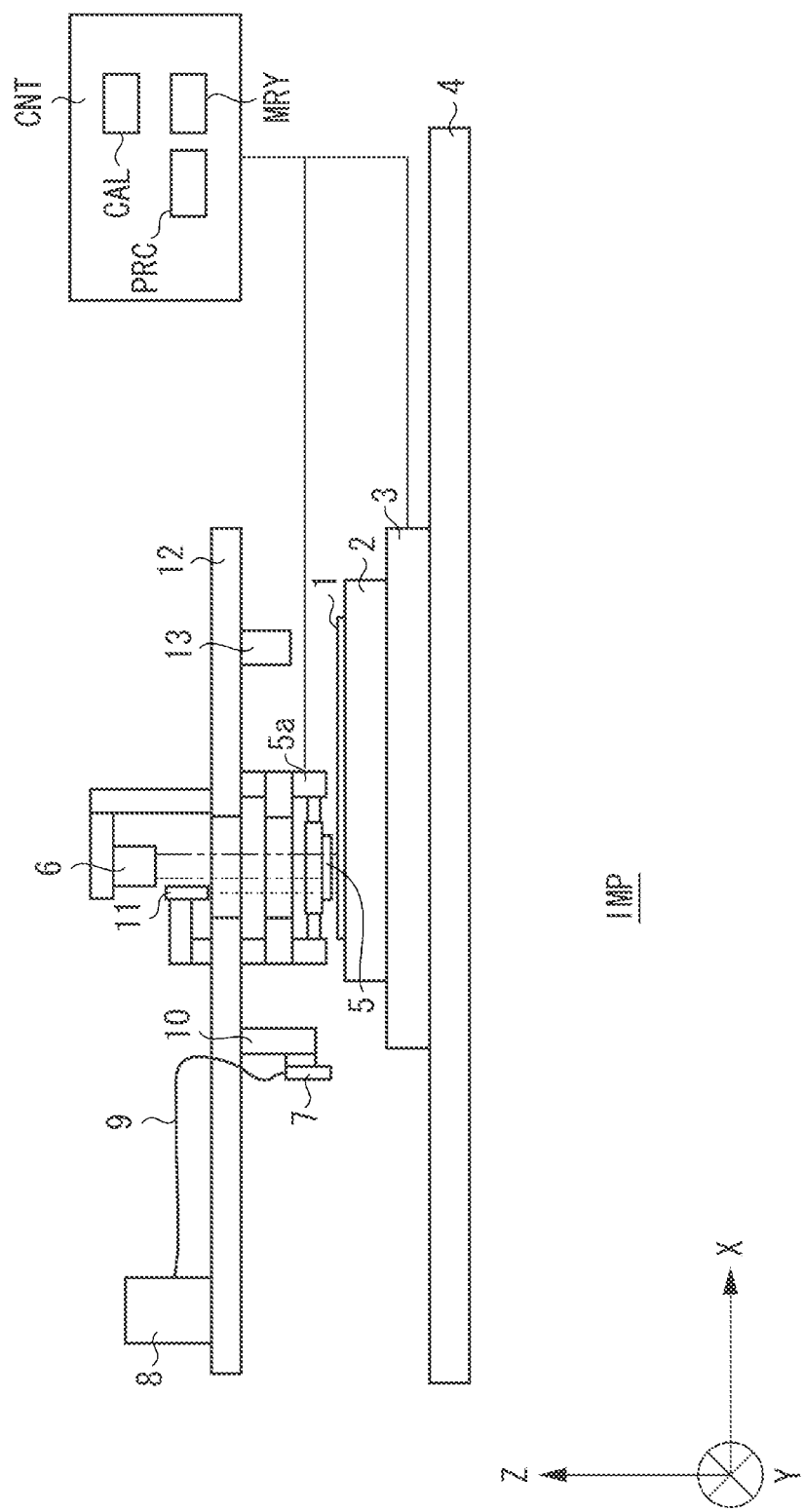
FIG. 1 illustrates an imprint apparatus according to an exemplary embodiment disclosed herein.

Various exemplary embodiments, features, and aspects of the invention will be described in detail below with reference to the drawings. Components similar to those in the drawings are given the same reference numerals and the duplicated description thereof is omitted.

<Imprint Apparatus>

An outline of an imprint apparatus IMP according to an exemplary embodiment of the present invention is described with reference to FIGS. 1 and 2. The method herein described is an optical-curing imprint method in which an imprint material is irradiated with light to be cured. More specifically, the imprint method uses ultraviolet rays as light and an ultraviolet curable resin (resin, photoresist) as the imprint material.

The configuration of the imprint apparatus according is described below. FIG. 1 illustrates the imprint apparatus according to an exemplary embodiment. As illustrated in FIG. 1, a direction in which a mold is pressed against a substrate is taken as Z axis and the directions that are perpendicular to the Z axis and orthogonal to each other on the in-plane of the substrate are taken as X and Y axes. The imprint apparatus IMP includes a substrate chuck 2 for suctioning and holding a substrate 1, a substrate stage 3 moving while holding the substrate chuck 2, and a base frame 4 for holding and positioning the substrate stage 3. Herein, a vacuum chuck is used as the substrate chuck 2. The substrate stage 3 is moved in the X and Y directions on the base frame 4.

The imprint apparatus IMP further includes a mold holding portion 5a for holding a mold 5 and being driven in the Z axis, a light source 6 for emitting ultraviolet rays, a supply unit 7 (dispenser) for supplying an uncured resin to the substrate 1, a tank 8 for storing the uncured resin, and an alignment scope 11 (detection unit). The imprint apparatus IMP may further include an off-axis scope 13 as the detection unit. The mold holding portion 5a, the light source 6, the supply unit 7, the tank 8, the alignment scope 11, and the off-axis scope 13 are supported by a surface plate 12.

The mold 5 (an original plate or a template) on the surface on which an uneven pattern is formed is composed of a material (quartz) through which the ultraviolet rays illuminated from the light source 6 can pass. Hereinafter, a place where the pattern is formed on the mold 5 is referred to as a pattern area. The mold holding portion 5a is moved in the Z axis direction to bring the pattern formed in the mold 5 into contact with the uncured resin on the substrate 1.

The light source 6 is an ultraviolet generating apparatus. The ultraviolet rays emitted from the light source 6 pass through the mold 5 and cure the uncured resin. The light source 6 includes an optical element (concave mirror) for concentrating and forming light emitted from the light source in addition to a light source such as a halogen lamp generating i line and g line, for example.

The supply unit 7 changes the uncured resin into fine droplets and discharges the droplets to coat the substrate 1 with a predetermined amount of the uncured resin. The supply unit 7 is connected to the tank 8 through a pipe 9, to supply the uncured resin from the tank 8 to the supply unit 7. There may be provided a moving unit 10 for moving the supply unit 7 between a discharge position of the uncured resin and a retreating position (maintenance position).

As illustrated in FIG. 2, the moving unit 10 positions the supply unit 7 at the discharge position at the time of a normal discharging operation and moves the supply unit 7 to the retreating position at the time of maintenance. A nozzle or others of the supply unit 7 are cleaned and replaced at the retreating position.

The alignment scope 11 is a microscope for aligning the position of a pattern on the substrate 1 with the position of the mold 5 after the supply unit 7 supplies the uncured resin onto the substrate 1. The alignment scope 11 detects alignment marks provided on the mold 5 and the substrate 1. An amount of displacement between the two marks is acquired from the detection results and the substrate stage 3 is moved to reduce the amount of displacement, whereby the position of the substrate 1 and the position of the mold 5 are aligned. Alternatively, the mold holding portion 5a may be moved instead of the substrate stage 3 to align the position of the substrate 1 and the position of the mold 5. Still alternatively, the substrate stage 3 and the mold holding portion 5a may be moved simultaneously or sequentially to perform alignment.

<Imprint Cycle>

Figure 3:
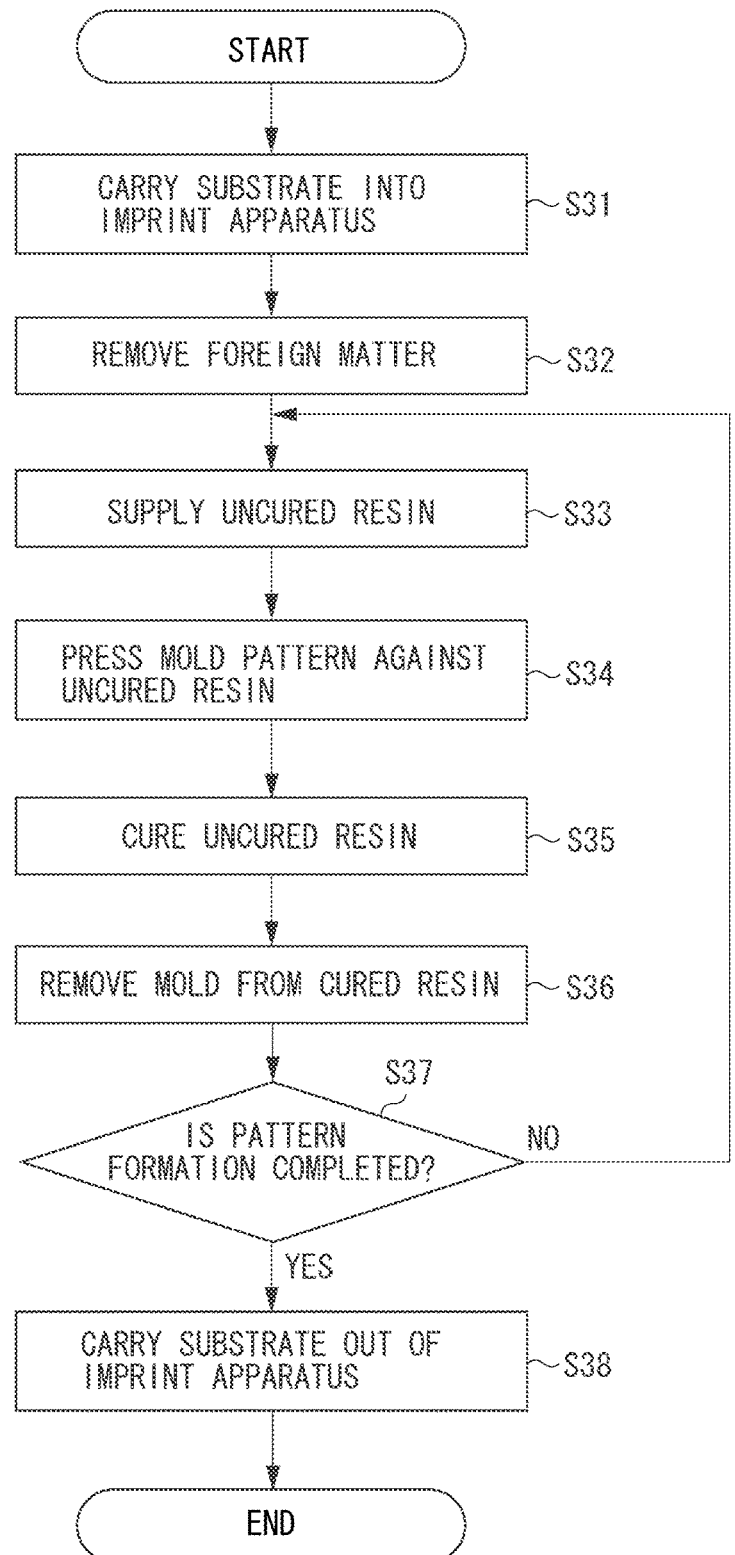
FIG. 3 is a flow chart illustrating a flow of an imprint cycle.

FIG. 3 is a flow chart illustrating an imprint cycle. FIG. 4 is the imprint apparatus performing the imprint cycle. The imprint apparatus IMP according to an exemplary embodiment of the present invention repeats the imprint cycle to form a pattern in a plurality of shot areas of the substrate 1. The term "shot area" refers to an area which is formed on the substrate 1 and where the pattern area of the mold 5 is transferred by one-time imprint. The shot area may be the entire pattern area of the mold 5 or the part thereof. A pattern may be previously formed in the shot area by another lithography apparatus including the imprint apparatus or a pattern does not need to be formed.

Hereinafter, the imprint cycle is performed by the imprint apparatus IMP. The imprint cycle illustrated in FIG. 3 is carried out by executing the program stored in a memory MRY included in a control unit CNT illustrated in FIG. 1. A processor PRC included in the control unit CNT processes the program stored in the memory MRY. Thus, the operation of the imprint cycle of the exemplary embodiment of the present invention is executed according to the program stored in the memory MRY of the control unit CNT.

Figure 4A:
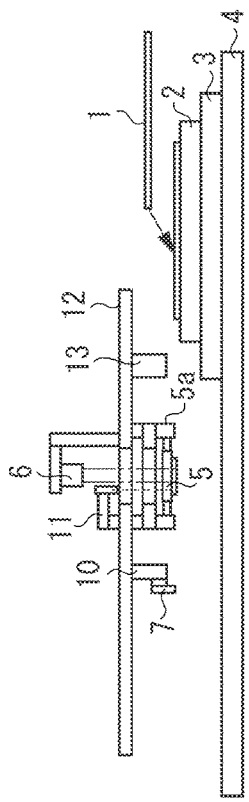
FIGS. 4A, 4B, 4C, and 4D illustrate an imprint apparatus performing an imprint cycle.
Figure 4B:
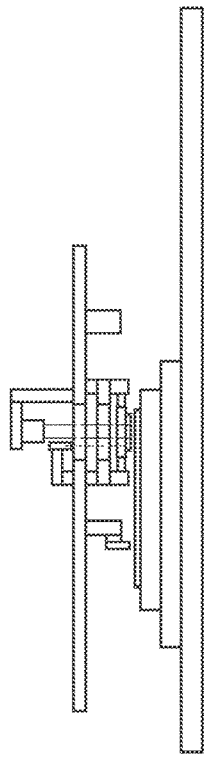
Figure 4C:
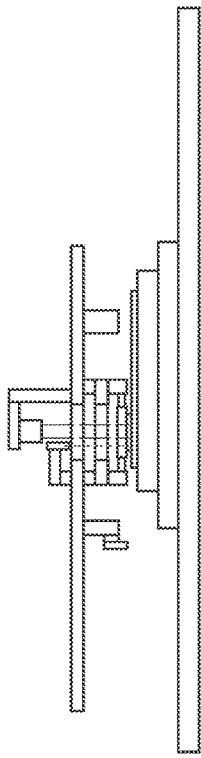
Figure 4D:
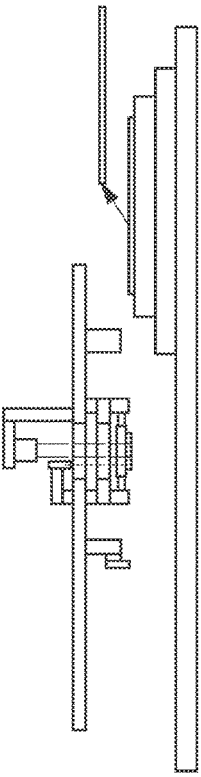

When the imprint cycle is started, in step S31, the substrate 1 is carried into the imprint apparatus IMP (refer to FIG. 4A). A substrate conveyance unit (not illustrated) lays the substrate 1 on the substrate chuck 2 from the outside of the imprint apparatus IMP. When the substrate 1 is laid on the substrate chuck 2, the off-axis scope 13 detects a plurality of positioning marks formed on the substrate 1 and acquires the array (position) of a plurality of shot areas on the substrate 1 from the detection results. The off-axis scope 13 is a scope capable of detecting the positioning marks on the substrate 1 not via the mold 5.

When the substrate 1 is carried into the imprint apparatus IMP, in step S32, a foreign-matter removal step described below is carried out because a foreign matter may be attached to the mold 5.

In step S32, the foreign-matter removal step is carried out and then the substrate stage 3 is moved to a position under the supply unit 7 to supply the uncured resin to the shot area to which a pattern is transferred. In step S33 (supply step), the uncured resin is supplied onto the substrate W from a discharge port of the supply unit 7 (refer to FIG. 4B). The substrate 1 is moved while the uncured resin is being discharged from the discharge port to supply the imprint material for each shot area. In step S33 (supply step), the uncured resin may be supplied to a plurality of shot areas or may be collectively supplied to all over the substrate.

The shot area to which the uncured resin is supplied is moved to a position under the mold M in which the pattern P is formed, based on the array of the shot areas acquired when the substrate 1 is carried into the imprint apparatus IMP. The position alignment method of the present exemplary embodiment may be of the global alignment method or the die-by-die alignment method. In the global alignment method, a mark formed in the shot area on the substrate 1 is detected, the array of a plurality of shot areas is acquired from the detection results, and the position of the mold is aligned with the position of the substrate based on the acquired array. In the die-by-die alignment method, the alignment scope 11 detects the mark formed on the mold for each shot area and the mark formed in the shot area, a relative amount of displacement between the substrate 1 and the mold 5 is acquired from the detection results, and the position alignment is performed to eliminate the displacement.

After the position alignment is performed, the substrate 1 is moved closer to the mold 5 (to narrow the gap) and the uncured resin on the substrate 1 is brought into contact with the pattern of the mold 5 (contact step). In step S34 (imprint step), the uncured resin is pressed against the pattern of the mold 5 to fill the concave portion of pattern of the mold 5 with the uncured resin (refer to FIG. 4C).

In step S35 (cure step), after the concave portion of the pattern of the mold 5 is filled with the uncured resin, the uncured resin is irradiated with ultraviolet rays with the uncured resin brought into contact with the pattern of the mold 5 to cure the uncured resin. The mold 5 is made of a material transmitting ultraviolet rays (quartz, for example). The ultraviolet rays emitted from the light source 6 pass through the mold 5 and are incident on the uncured resin.

After the uncured resin is cured, in step S36 (separating step), a gap between the substrate 1 and the mold is increased to separate the mold 5 from the cured resin. The mold 5 is separated from the cured resin to form the pattern on the substrate 1 (or transfer the pattern thereto). In the separating step, the mold 5 may be separated from the resin by driving the mold holding portion 5a or the substrate stage 3. Alternatively, the mold 5 may be separated from the resin by simultaneously or sequentially driving the mold holding portion 5a and the substrate stage 3.

After the pattern is formed on the substrate 1 in step S36 of the separating step, in step S37, it is determined whether the formation of the patterns is completed on all the shot areas on the substrate 1. If the formation of the patterns is not completed (NO in step S37), the step S33 of the supply step described above is carried out. The substrate stage 3 is moved and the uncured resin is supplied to the shot area where a pattern is to be formed next. In a case where the uncured resin is previously supplied to a plurality of shot areas or the uncured resin is collectively supplied to the whole surface of the substrate 1, the processing can proceed to the step S34 of the imprint step not via the step S33 of the supply step. If the formation of patterns is completed (YES in step S37), in step S38, the substrate 1 is carried out of the imprint apparatus IMP (refer to FIG. 4D). A substrate conveyance unit (not illustrated) carries the substrate W out from the substrate chuck 2 of the imprint apparatus IMP to the outside and ends the imprint cycle.

It was found that a foreign matter often attaches to the mold 5 between the time when the imprint apparatus IMP for performing the imprint cycle carries out the substrate 1 out of the apparatus IMP and the time when the imprint apparatus IMP carries thereof into the apparatus IMP. For this reason, it was found that when the imprint cycle was performed without the foreign matter being removed, the pattern of the mold is inaccurately formed on the substrate due to the foreign matter.

Embodiments discussed herein perform the foreign-matter removal step in step S32 using the shot area on the substrate 1 carried into the imprint apparatus IMP. The foreign-matter removal step for removing the foreign matter attached to the mold 5 is described below.

If the step S32 of the foreign-matter removal step is conducted in a shot area, among the shot areas on the substrate 1, to which the whole surface of the pattern of the mold 5 can be transferred (hereinafter referred to as a full shot-area), the shot area is affected by the foreign matter attached to the mold to be defective, which lowers productivity. The whole patterns of mold 5 can be formed in the full shot area. The term "defective shot" refers to a shot area which cannot be used as a device any more due to the defect of the pattern.

The foreign-matter removal step according to a first exemplary embodiment is conducted in a shot area, among the shot areas on the substrate 1, to which only a part of the pattern of the mold 5 can be formed (hereinafter referred to as a part shot-area). This is sometimes called edge shot because the edge of the substrate 1 is included therein. The part shot-area is an area where a part of the pattern of the mold 5 can be formed and which is not normally used for producing a device. For this reason, even if the foreign-matter removal step is conducted using the part shot-area, productivity is not lowered. In a case where a plurality of chip areas is formed in one shot area, a pattern is sometimes formed in the chip area formed in the part shot-area. In this case, the pattern of the mold is not always transferred to all the areas where the imprint material is in contact with the mold on the part shot-area. For this reason, if a foreign matter exists in the part shot-area and outside the chip area and the foreign-matter removal step is conducted using the part shot-area, it does not cause defective shot. For this reason, even if the part shot-area is used in the foreign-matter removal step in step S32, reduction in productivity may be suppressed.

Figure 5:
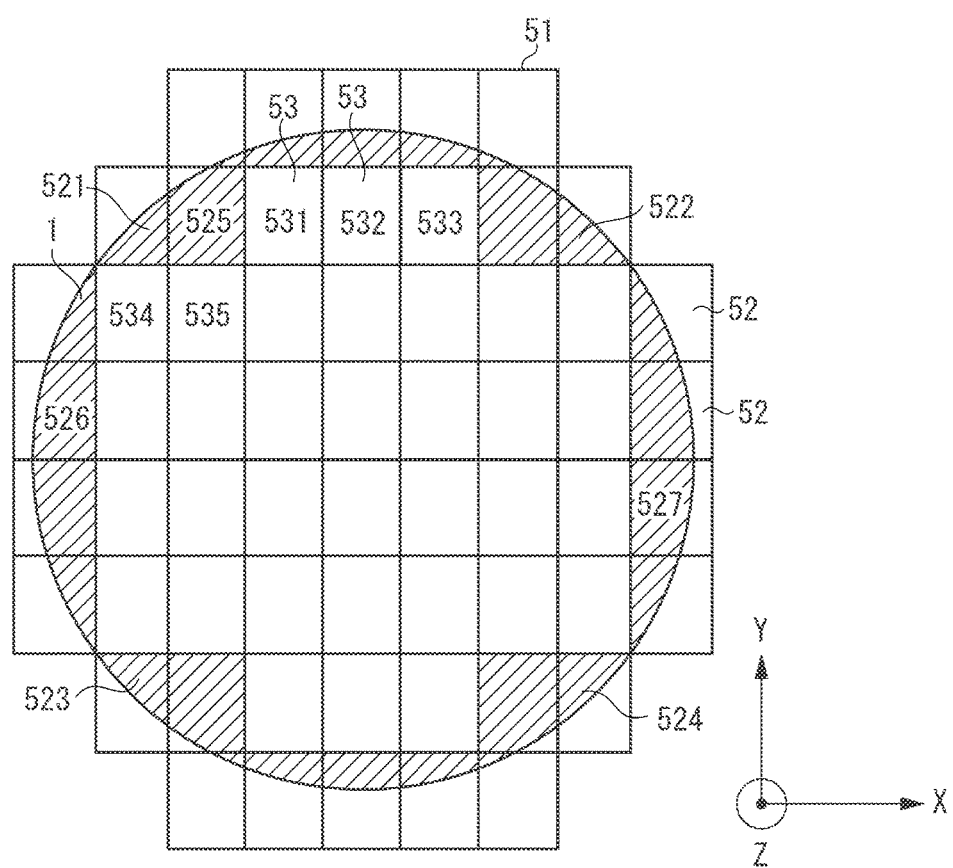
FIG. 5 illustrates a substrate and shot areas according to a first exemplary embodiment.

The first exemplary embodiment is described below with reference to FIG. 5. FIG. 5 illustrates a plurality of shot areas 51 on the substrate 1. Each rectangular area illustrated in FIG. 5 indicates the shot area 51. The rectangular area corresponds to the pattern area formed in the mold 5. A plurality of the shot areas 51 includes a part shot-area 52 and a full shot-area 53. The part shot-area 52 indicates a shot area where a part of the pattern of the mold 5 (an area indicated by slanted lines in FIG. 5) can be formed.

Usually, patterns are formed in full shot-areas 531, 532, 533, 534, and 535 in this order. As the problem described above, a pattern cannot be often accurately formed in the full shot-area 531 where the pattern is first formed, due to the influence of a foreign matter attached to the mold 5.

For this reason, a pattern is formed in the part shot-area 52 in step S32 of the foreign-matter removal step before a pattern is formed in the full shot-area 53. The formation of a pattern in step S32 of the foreign-matter removal step is often referred to as dummy imprint. In the dummy imprint, although a pattern does not need to be accurately formed, which is herein referred to as "to form a pattern" because a foreign matter is removed by conducting the steps S33 to S36 illustrated in FIG. 3. Even a pattern, which is presumed to be a part of the pattern area of the mold, is often formed in the part shot-areas 525 and 526, among the part shot-areas, to which more than half (half angle of view) the pattern of the mold 5 can be transferred, not to cause a defective shot. A pattern, which is presumed to be a part of the pattern of the mold, is often formed in the part shot-area with an effective angle of view or more by setting the effective angle of view (a predetermined size of the pattern area), not to cause the defective shot.

The foreign-matter removal step conducted by using the part shot-areas 521, 522, 523, and 524 is described below. Even if a pattern defect occurs in any of the part shot-areas, that does not affect the production of a device in the areas. The part shot-area with an effective angle of view or less, for example, is selected.

In the foreign-matter removal step, each of the part shot-areas 521, 522, 523, and 524 is subjected to the supply step in step S33, the imprint step (contact step) in step S34, the cure step in step S35, and the separating step in step S36 described in FIG. 3. The uncured resin supplied onto the part shot-area is brought into contact with the pattern of the mold 5 (contact step) and the uncured resin is cured with the resin brought into contact therewith, and thereby the foreign matter attached to the mold 5 can be to be moved to the cured resin to be removed.

FIGS. 6A, 6B, 6C, and 6D illustrate the mold 5 and the pattern area 5b formed in the mold 5. An area where the pattern area 5b is brought into contact with the resin to transfer the pattern onto the part shot-area is indicated by slanted lines. In general, it cannot often be seen where a foreign matter is attached to the pattern area 5b of the mold 5. Therefore, it is desirable that the uncured resin is caused to contact the whole surface of the pattern area 5b of the mold 5 in the foreign-matter removal step. Therefore, a case where a pattern is formed in the part shot-areas 521, 522, 523, and 524 is assumed. In FIG. 6A, an area where the pattern area 5b is brought into contact with the uncured resin is indicated by slanted lines in a case where a pattern is transferred to the part shot-area 521. In FIG. 6B, an area where the pattern area 5b is brought into contact with the uncured resin is indicated by slanted lines in a case where a pattern is transferred to the part shot-area 522. In FIG. 6C, an area where the pattern area 5b is brought into contact with the uncured resin is indicated by slanted lines, in a case where a pattern is transferred to the part shot-area 523. In FIG. 6D, an area where the pattern area 5b is brought into contact with the uncured resin is indicated by slanted lines, in a case where a pattern is transferred to the part shot-area 524. It can be seen that the whole surface of the pattern area 5b of the mold 5 is in contact with the uncured resin by combining the areas where the resin is in contact therewith illustrated in FIGS. 6A to 6D.

In a case where any shot area can be selected provided that it is the part shot-area 52, patterns may be first formed in all the part shot-areas 52 as the foreign-matter removal step.

Figure 7A:
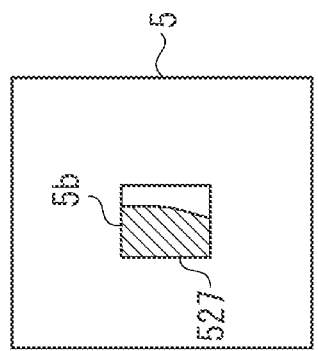
FIGS. 7A and 7B illustrate areas where the pattern area of the mold is brought into contact with the resin.
Figure 7B:
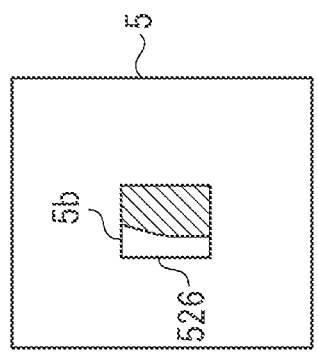

Since it is desirable that the uncured resin is caused to contact the whole surface of the pattern area 5b, the part shot-areas 526 and 527 may be selected to perform imprint in the foreign-matter removal step. FIGS. 7A and 7B illustrate the mold 5 and the pattern area 5b formed in the mold 5. An area where the pattern area 5b is brought into contact with the resin to transfer the pattern onto the part shot-area is indicated by slanted lines. A case where the imprint is performed in the part shot-areas 526 and 527 is assumed. In FIG. 7A, an area where the pattern area 5b is brought into contact with the uncured resin is indicated by slanted lines, in a case where a pattern is transferred to the part shot-area 526. In FIG. 7B, an area where the pattern area 5b is brought into contact with the uncured resin is indicated by slanted lines, in a case where a pattern is transferred to the part shot-area 5227. It can be seen that the whole surface of the pattern area 5b of the mold 5 is in contact with the uncured resin by combining the areas where the resin is in contact therewith illustrated in FIGS. 7A and 7B.

If an area where the pattern area 5b is not brought into contact therewith is small like the part shot-area 525, the imprint has only to be performed on the part shot-area 525.

Thus, the foreign-matter removal step is carried out in step S32 by using the part shot-area 52, the processing proceeds to step S33, and patterns are sequentially formed in other shot areas. This allows reducing the influence of a foreign matter attached to the mold 5 and forming patterns in the shot area on the substrate.

A foreign matter or a defect (error) of a ground layer exists in the substrate 1 carried into the imprint apparatus IMP, and sometimes the shot area which is defective may be included when a pattern is formed by the imprint apparatus. Herein, a shot area having an error among the shot areas of the substrate 1 is referred to as an error shot area and a shot area without an error is referred to as a normal shot area.

If the foreign-matter removal step of step S32 is carried out in the normal shot area among the shot areas of the substrate 1, the shot area becomes defective due to the influence of a foreign matter attached to the mold, which reduces productivity.

In a second exemplary embodiment, the foreign-matter removal step is carried out in the error shot area among the shot areas of the substrate 1. A pattern is formed in the error shot area in the foreign-matter removal step of step S32 to allow suppressing reduction in productivity and removing the foreign matter attached to the mold 5.

Figure 8:
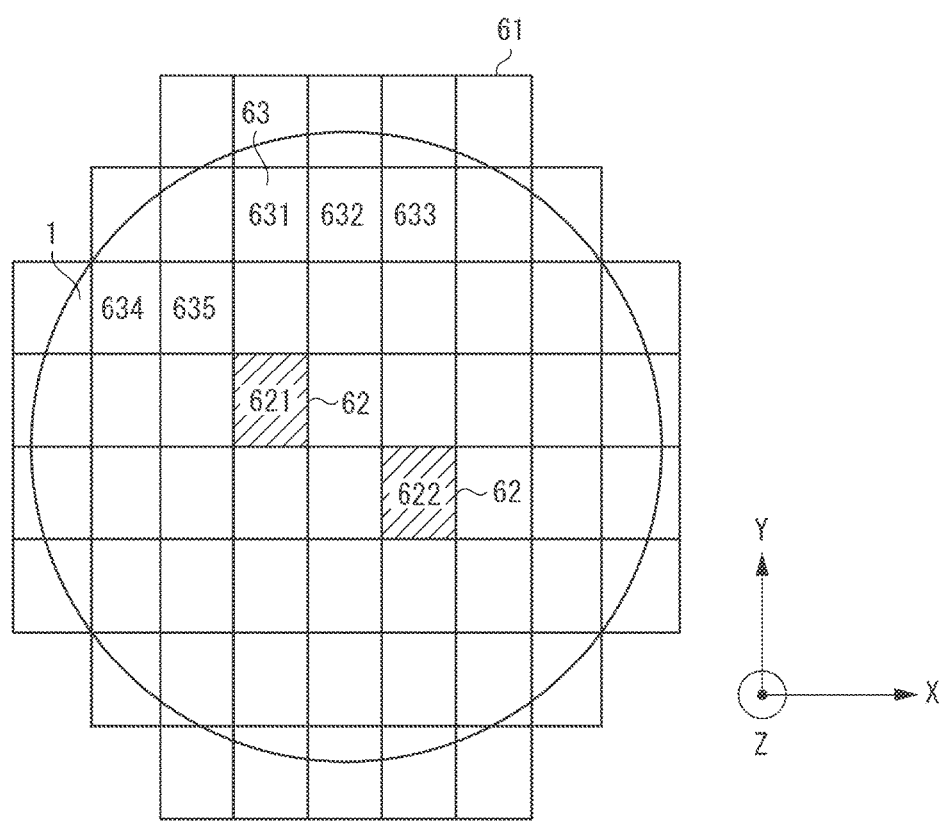
FIG. 8 illustrates a substrate and shot areas according to a second exemplary embodiment.

The second exemplary embodiment is described below with reference to FIG. 8. FIG. 8 illustrates a plurality of shot areas 61 on the substrate 1. Each rectangular area illustrated in FIG. 8 indicates the shot area 61. The rectangular area corresponds to the pattern area formed in the mold 5. A plurality of the shot areas 61 includes error shot-areas 62 and normal shot-areas 63. There will be described below a case where the substrate 1 includes error shot-areas 621 and 622 (the shot areas indicated by slanted lines in FIG. 8). Herein, other shot areas are regarded as normal shot areas. The normal shot area may include a part shot area as well as the full shot area described in the first exemplary embodiment.

The error shot-area 62 is a shot area which is already known, before the substrate 1 is carried into the imprint apparatus IMP, that a defect will exists in a pattern formed in that area. For example, information about the quantity (number) and the location (place) of the error shot areas can be acquired in advance by inspecting the substrate 1 before it is carried into the imprint apparatus IMP. The information about the error shot area 62 acquired in advance before the substrate 1 is carried into the imprint apparatus IMP is stored in the memory MRY of the control unit CNT. When the imprint cycle illustrated in FIG. 3 is executed, a pattern is first formed in the error shot area 62 in the foreign-matter removal step based on the information about the error shot area 62 stored in the memory MRY of the control unit CNT.

Usually patterns are formed in normal shot-areas 631, 632, 633, 634, and 635 in this order. A pattern may not be able to be accurately formed in the normal shot-area 631 where the pattern is first formed, due to the influence of a foreign matter attached to the mold 5.

For this reason, a pattern is formed in the error shot-area 62 in step S32 of the foreign-matter removal step before a pattern is formed in the normal shot-area 63. The foreign-matter removal step conducted by using the error shot-areas 621 and 622 is described below. Even if a pattern defect occurs in any of the error shot-areas in the imprint step, t the production of a device is not affected in the areas.

In the foreign-matter removal step, each of the error shot-areas 621 and 622 is subjected to the supply step in step S33, the imprint step (contact step) in step S34, the cure step in step S35, and the separating step in step S36 described in FIG. 3. The uncured resin supplied onto the error shot-area is brought into contact with the pattern of the mold 5 (contact step) and the uncured resin is cured with the resin brought into contact therewith, and thereby the foreign matter attached to the mold 5 can be moved to the cured resin and to be removed.

The foreign-matter removal step is carried out in step S32 by using the error shot-area 62, the processing proceeds to step S33, and patterns are sequentially formed in the normal shot areas. This allows reducing the influence of a foreign matter attached to the mold 5 and forming patterns in the shot area on the substrate.

The above exemplary embodiments are described as the foreign-matter removal step aimed at removing a foreign matter attached to the mold 5. However, even though a foreign matter is not attached to the mold 5, it is preferable to first form a pattern in the part shot-area or the error shot-area.

An ingredient such as a separating agent with a certain density is added to the resin. The mold 5 is pressed against the uncured resin in the imprint step of step S34 to cause the separating agent in the uncured resin to seep out from the resin to the mold and attach thereto in a film form. The mold is filmed with the separating agent to make the mold 5 easy to detach from the cured resin in the separating step of step S36. This improves a separating performance and allows a pattern to decrease defect caused in separating. Although film is formed on the mold in the imprint step of step S34, the previously filmed mold 5 is pressed against the uncured resin to conduct the separating step of step S36, allowing a more stable separating performance to be secured.

If the filmed mold is left as it is for a long period of time (for example, the period during which the substrate is carried out of the imprint apparatus and a new substrate is carried thereinto), the separating agent volatilizes and sometimes causes the film of the separating agent to disappear from the mold. For this reason, after the substrate is carried into the imprint apparatus, a pattern is first formed in the part shot-area and the error shot-area to allow the film of the separating agent to be formed on the mode. The stable separating performance can be secured in forming a pattern in the full shot-area or the normal shot-area, and the pattern defect generated at the time of separating can also be reduced.

In the above exemplary embodiments, the step (dummy imprint) for forming in the part shot-area and the error shot-area is described as the foreign-matter removal step of step S32. However, the pattern is formed basically in the similar procedure (method) both in the foreign-matter removal step and in steps S33 to S36 conducted afterward. For this reason, there is no need for specifically providing the foreign-matter removal step of step S32. In this case, when the supply step is conducted in step S33 after the substrate 1 is carried into the imprint apparatus IMP in step S31, the uncured resin is first supplied into the part shot-area and the error shot-area. The order of forming patterns in a plurality of the shot areas of the substrate 1 is determined in such a manner that patterns are first formed in the part shot-area and the error shot-area, and the imprint cycle is executed. Patterns are formed in the first several part and error shot-areas (dummy imprint) to remove the foreign matter attached to the mold 5.

In the above exemplary embodiments, the imprint apparatus IMP has been described using ultraviolet rays as light. However, another imprint method is available in which the resin is cured by irradiating it with light with other wavelengths other than those of ultraviolet rays as light. In this case, the imprint material may be appropriately selected according to the wavelength of light to be emitted. Furthermore, the present invention can be applied to the imprint method for curing the resin using other energies (heat, for example) other than the imprint method using light.

<Device Manufacturing Method>

A method for manufacturing a device (a semiconductor integrated circuit, a liquid crystal display device, and micro electro mechanical systems (MEMS)) as an article includes a step for transferring (forming) a pattern to a substrate (a wafer, a glass plate, and a film substrate) using the above imprint apparatus. The method for manufacturing the device may further include a step for etching the substrate to which the pattern is transferred. If other articles such as patterned media (recoding medium) or an optical element are manufactured, the method may include other steps for processing the substrate to which the pattern is transferred instead of etching. The method for manufacturing the article according to the present exemplary embodiments is advantageous in at least one of performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-136919 filed Jun. 28, 2013, which is hereby incorporated by reference herein in its entirety.

What is claimed is:

1. An imprint apparatus configured to form a pattern of an imprint material supplied to a plurality of shot areas on a substrate using a mold, the imprint apparatus comprising:
   a mold holding portion configured to hold the mold; and
   a control unit configured to:
      cause the mold holding portion to successively bring a plurality of part areas of a whole pattern of the mold into contact with the imprint material supplied to respective part shot-areas including a periphery on the substrate for removing foreign matter from the part areas of the whole pattern of the mold, wherein a combination of the respective part areas of the whole pattern of the mold includes the whole pattern of the mold; and
      cause the mold holding portion to bring the whole pattern of the mold into contact with the imprint material supplied to a full shot-area for forming the pattern of the imprint material to the full shot-area on the substrate using the whole pattern of the mold brought into contact with the imprint material supplied to the respective part shot-areas.

2. The imprint apparatus according to claim 1, wherein the respective part shot-areas include a first part shot-area and a second part shot-area not adjacent to the first part shot-area.

3. The imprint apparatus according to claim 1, wherein the respective part shot-areas include a first part shot-area and a second part shot-area on a side opposite the first part shot-area relative to the center of the substrate.

* * * * *